United States Patent
Chung et al.

(10) Patent No.: US 8,450,808 B1
(45) Date of Patent: May 28, 2013

(54) HVMOS DEVICES AND METHODS FOR FORMING THE SAME

(75) Inventors: Shu-Wei Chung, Taichung (TW); Kuo-Feng Yu, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/351,105

(22) Filed: Jan. 16, 2012

(51) Int. Cl.
*H01L 27/085* (2006.01)
*H01L 21/70* (2006.01)

(52) U.S. Cl.
USPC ............ 257/369; 257/372; 438/199

(58) Field of Classification Search
USPC .............. 257/369, 391, 372, 376, E27.064, 257/E21.632; 438/199
See application file for complete search history.

(56) References Cited

U.S. PATENT DOCUMENTS

| | | | |
|---|---|---|---|
| 7,701,005 B1* | 4/2010 | Bulucea et al. | 257/336 |
| 7,879,669 B1* | 2/2011 | Teng et al. | 438/217 |
| 7,906,400 B2* | 3/2011 | Takao | 438/303 |
| 2002/0093046 A1* | 7/2002 | Moriya et al. | 257/315 |
| 2006/0223269 A1* | 10/2006 | Honma | 438/294 |
| 2008/0054356 A1* | 3/2008 | Yoshida | 257/344 |
| 2008/0230850 A1* | 9/2008 | Takao | 257/392 |
| 2010/0244106 A1* | 9/2010 | Parker et al. | 257/288 |
| 2010/0244128 A1* | 9/2010 | Bulucea et al. | 257/335 |
| 2010/0244130 A1* | 9/2010 | Bulucea et al. | 257/336 |
| 2013/0015535 A1* | 1/2013 | Yang et al. | 257/408 |

* cited by examiner

*Primary Examiner* — Ngan Ngo
(74) *Attorney, Agent, or Firm* — Slater & Matsil, L.L.P.

(57) ABSTRACT

A device includes a first and a second HVMOS device, each includes a gate electrode over a semiconductor substrate, wherein the gate electrodes of the first and the second HVMOS devices have a first gate length and a second gate length, respectively, with the second gate length being greater than the first gate length. Each of the first and second HVMOS devices includes a first and a second well region of a p-type and an n-type, respectively, and a native region between and contacting the first and the second well regions. The first and the second well regions have higher impurity concentrations than the native region. The native region of the first HVMOS device and the native region of the second HVMOS device have a first native-region length and a second native-region length, respectively, wherein the second native-region length is greater than the first native-region length.

20 Claims, 7 Drawing Sheets

HVMOS DEVICES AND METHODS FOR FORMING THE SAME

BACKGROUND

High-Voltage Metal-Oxide-Semiconductor (HVMOS) devices are widely used in many electrical devices, such as Input/output (I/O) circuits, Central Computing Unit (CPU) power supplies, power management systems, AC/DC converters, etc. HVMOS devices typically include drain regions and laterally-diffused drain regions enclosing the drain regions. Laterally-diffused drain regions are typically well regions having lower doping concentrations than the drain regions. The breakdown voltages of the HVMOS devices are accordingly high.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

High-Voltage Metal-Oxide-Semiconductor (HVMOS) devices and the methods of forming the same are provided in accordance with various exemplary embodiments. The intermediate stages of forming p-type HVMOS (HVPMOS) devices and n-type HVMOS (HVNMOS) devices are illustrated. The variations of the embodiments are discussed. Throughout the various views and illustrative embodiments, like reference numbers are used to designate like elements.

Figure 1:
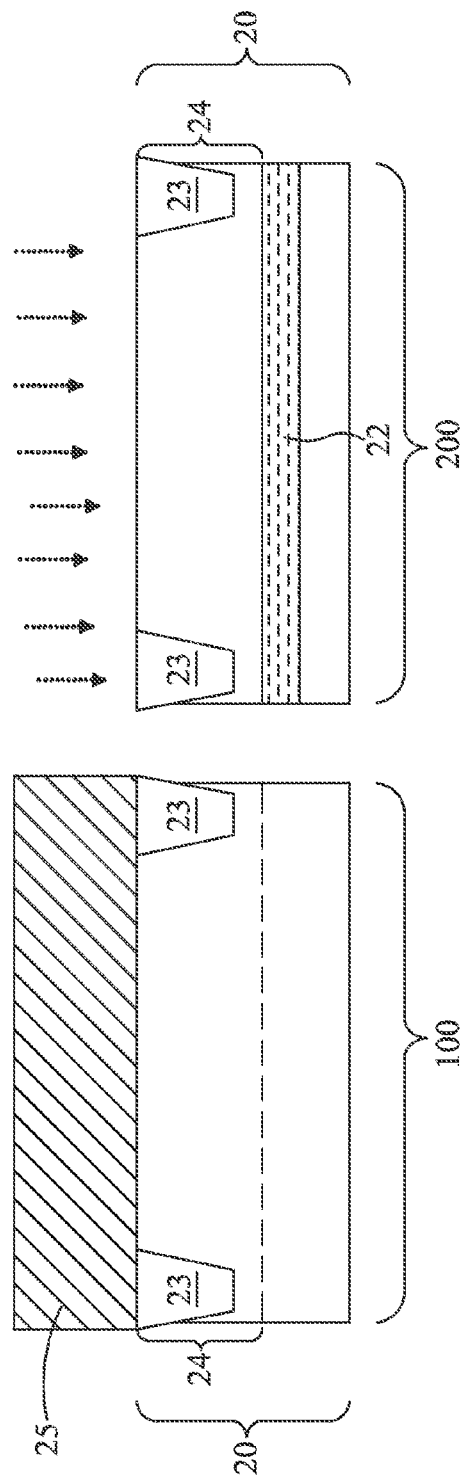
FIGS. 1 through 5 are cross-sectional views of intermediate stages in the manufacturing of a p-type High-Voltage Metal-Oxide-Semiconductor (HVMOS) device and an n-type HVMOS device in accordance with some exemplary embodiments.

FIGS. 1 through 5 illustrate cross-sectional views of intermediate stages in the manufacturing of an HVPMOS device and an HVNMOS device in accordance with some exemplary embodiments. Referring to FIG. 1, semiconductor substrate 20 is provided. Isolation regions 23, which may be Shallow Trench Isolation (STI) regions, extend from the top surface of semiconductor substrate 20 into semiconductor substrate 20. Semiconductor substrate 20 may comprise crystalline silicon or other semiconductor materials such as silicon germanium, silicon carbon, or the like. In accordance with some embodiments, semiconductor substrate 20 is lightly doped with a p-type impurity. In alternative embodiments, semiconductor substrate 20 is lightly doped with an n-type impurity. Semiconductor substrate 20 includes a first portion in HVNMOS region 100 and a second portion in HVPMOS region 200.

N+ Buried Layer (NBL) 22 may be formed in HVPMOS region 200 of semiconductor substrate 20, wherein NBL 22 is proximate, and below, the top surface of substrate 20. NBL 22 may be formed by implanting an n-type dopant into an intermediate region of substrate 20. For example, NBL 22 may be formed by implanting phosphorous to a concentration between about $1 \times 10^{17}/cm^3$ and about $1 \times 10^{19}/cm^3$, or to a higher concentration. Alternatively, other n-type dopants such as arsenic, phosphorus, and antimony may be implanted. In some alternative embodiments, NBL 22 is formed by performing an implantation (using photo resist 25 as an implantation mask) on a surface portion of an original semiconductor substrate 20. An addition portion, which is marked as 24, is epitaxially grown over NBL 22. The additional portion 24 is also grown on the original semiconductor substrate 20 in HVNMOS region 100. In some embodiments, the epitaxially grown semiconductor substrate portion 24 is intrinsic, and has no p-type or n-type impurities doped therein. In alternative embodiments, semiconductor substrate portion 24 is in-situ doped with a low p-type or n-type impurity concentration lower than about $1.5 \times 10^{15}/cm^3$, for example. The in-situ doping may be performed with the proceeding of the epitaxy.

Figure 2:
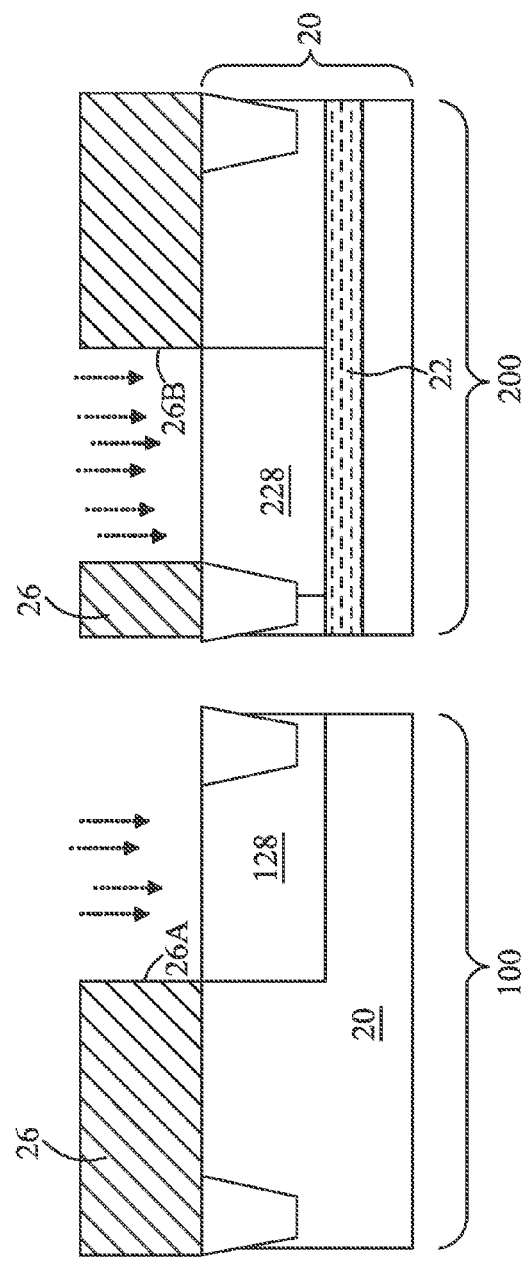

Referring to FIG. 2, a mask such as photo resist 26 is formed over semiconductor substrate 20. Photo resist 26 is then patterned, so that a first portion of semiconductor substrate 20 in HVNMOS region 100 and a second portion of semiconductor substrate 20 in HVPMOS region 200 are exposed. An implantation is then performed to implant an n-type impurity into semiconductor substrate 20. As a result, n-well regions 128 and 228 are formed in HVNMOS region 100 and HVPMOS region 200, respectively. In some embodiments, n-well region 228 reaches, and is joined with, NBL 22. The doping concentration of n-well regions 128 and 228 may be between $1 \times 10^{14}/cm^3$ and about $1 \times 10^{19}/cm^3$ in some exemplary embodiments. Photo resist 26 is then removed.

Figure 3:
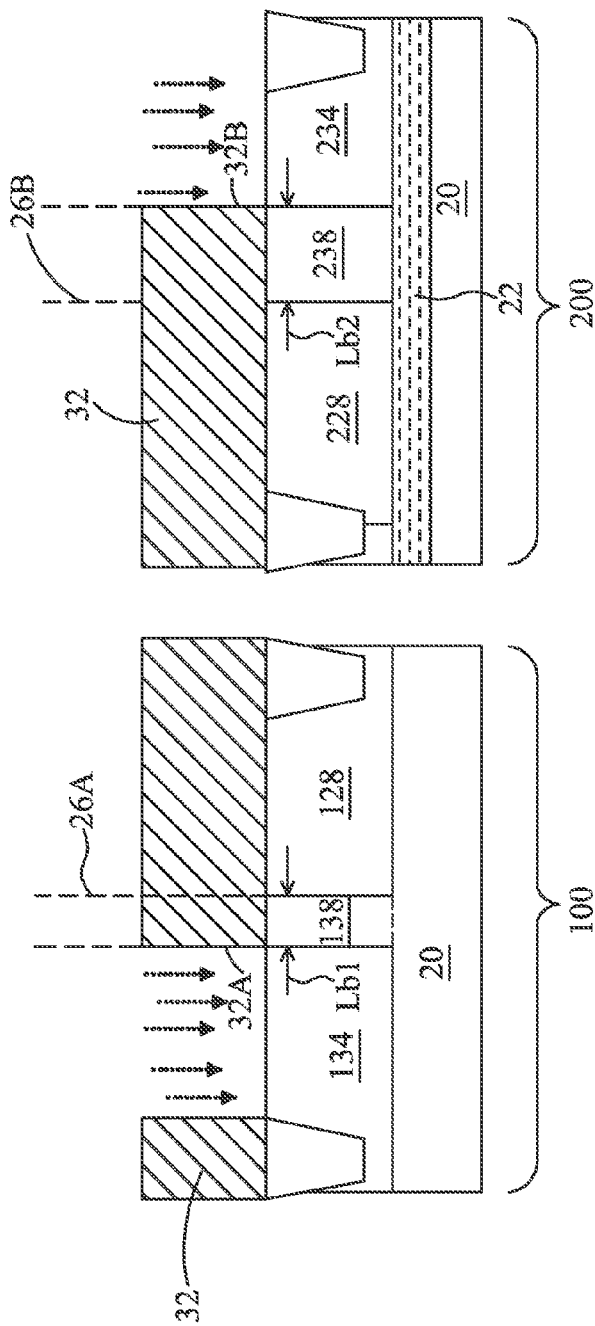

Referring to FIG. 3, a mask such as photo resist 32 is formed over semiconductor substrate 20. Photo resist 32 is then patterned. An implantation is then performed to implant a p-type impurity into semiconductor substrate 20. As a result, p-well regions 134 and 234 are formed in HVNMOS region 100 and HVPMOS region 200, respectively. In some embodiments, p-well region 234 reaches and is joined with NBL 22. Alternatively, the bottom surface of p-well region 234 is higher than the top surface of NBL 22. The doping concentration of p-well regions 134 and 234 may also be between $1 \times 10^{14}/cm^3$ and about $1 \times 10^{19}/cm^3$ in some exemplary embodiments. Photo resist 32 is then removed.

Referring back to FIG. 2, photo resist 26 has edges 26A and 26B in HVNMOS region 100 and HVPMOS region 200, respectively, wherein each of edges 26A and 26B is in one of vertical planes, which vertical planes are also denoted as 26A and 26B, respectively. Referring to FIG. 3, photo resist 32 has edges 32A and 32B in HVNMOS region 100 and HVPMOS region 200, respectively, wherein each of edges 32A and 32B is in one of vertical planes, which vertical planes are also denoted as 32A and 32B, respectively. Vertical planes 26A and 26B are also illustrated in FIG. 3. The distance between vertical planes 26A and 32A is denoted as Lb1. The distance between vertical planes 26B and 32B is denoted as Lb2. Throughout the description, the region between n-well region 128 and p-well region 134 is referred to as native region 138, which may have a low p-type impurity concentration lower than about $1.5 \times 10^{15}/cm^3$ in some embodiments, or may be intrinsic. Furthermore, the impurity concentration in native region 138 is lower than the impurity concentrations of n-well region 128 and p-well region 134. The region between n-well region 228 and p-well region 234 is referred to as native region 238, which may also have a low p-type impurity concentration lower than about $1.5 \times 10^{15}/cm^3$ in some embodiments, or may be intrinsic. The impurity concentration in native region 238 is lower than the impurity concentrations of n-well region 228 and p-well region 234.

Figure 4:
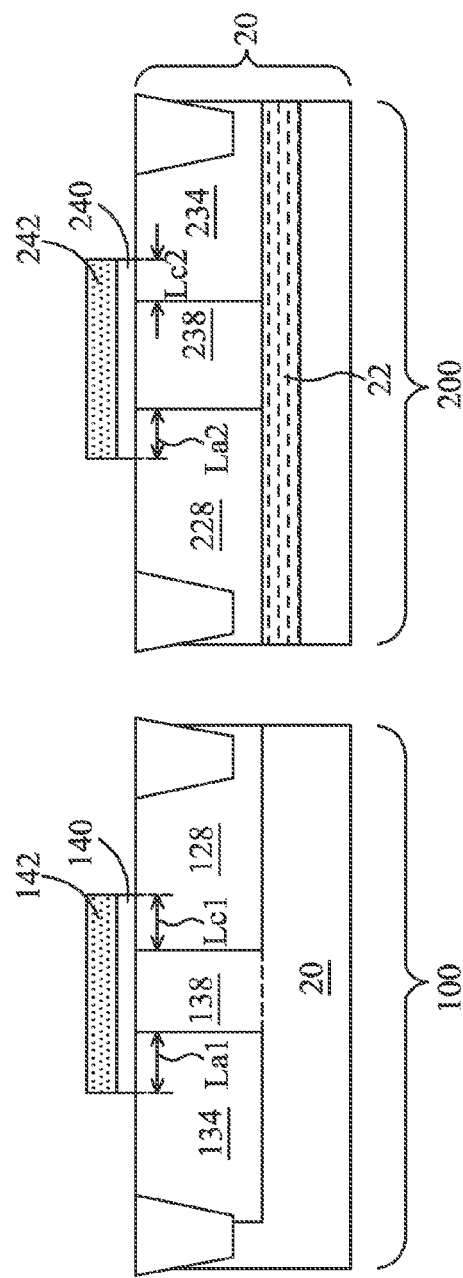
Figure 5:
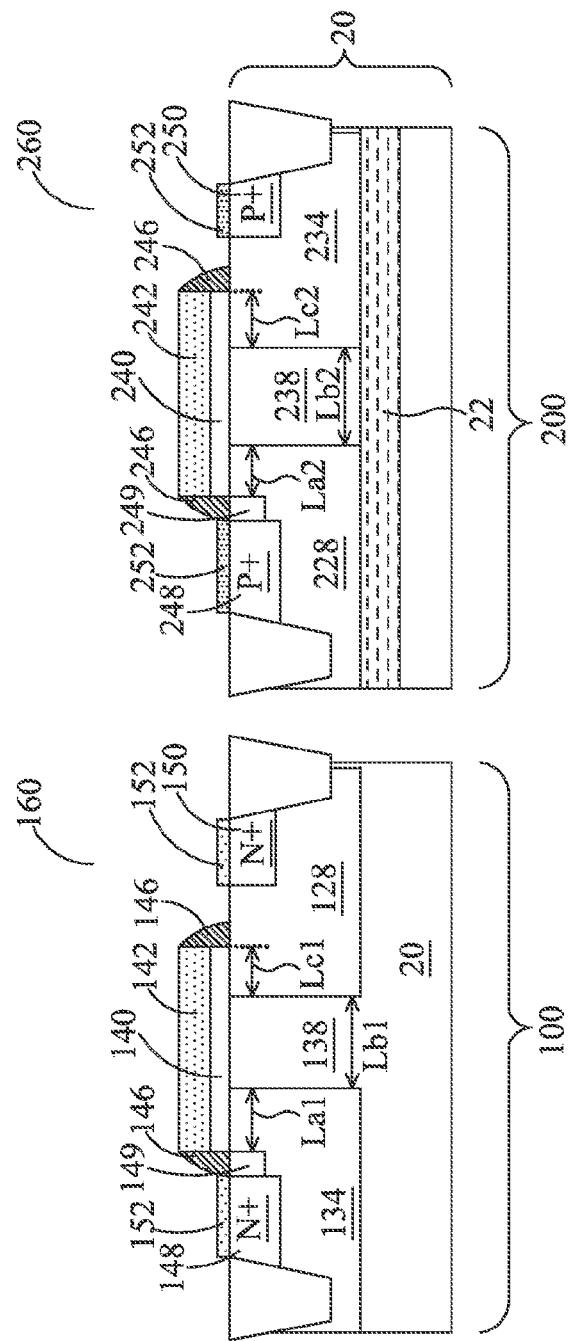

FIG. 4 illustrates the formation of gate dielectrics 140 and 240 and gate electrodes 142 and 242. Gate dielectrics 140 and 240 may include silicon oxide, silicon nitride, silicon carbide, silicon oxynitride, combinations thereof, and multi-layers thereof. High-k dielectric materials such as hafnium-based oxides, aluminum-based oxides, lanthanum-based oxides, and combinations thereof, may also be comprised in dielectrics 140 and 240. Gate electrodes 142 and 242 may be formed of doped polysilicon. Alternatively, metals, metal nitrides, metal silicides, and/or other conductive materials can be used to form gate electrodes 142 and 242. Each of gate dielectric 140 and gate electrode 142 include a center portion over and aligned to native region 138. Furthermore, gate dielectric 140 and gate electrode 142 also include side portions that extend over and aligned separately to edges to n-well region 128 and p-well region 134. The side portion overlapping the n-well region 128 has a length Lc1. The side portion overlapping the p-well region 134 has length La1. Each of gate dielectric 240 and gate electrode 242 includes a center portion over and overlapping native region 238. Furthermore, gate dielectric 240 and gate electrode 242 also include side portions that extend over and aligned separately to edges to n-well region 228 and p-well region 234, with the overlapping lengths being denoted as La2 and Lc2, respectively. The distance between n-well 128 and p-well region 134 is referred to as native region length Lb1 of native region 138. The distance between n-well 228 and p-well region 234 is referred to as native region length Lb2 of native region 238.

In subsequent process steps, gate spacers 146 and 246, n-type lightly doped source region 149, p-type lightly doped source region 249, heavily doped source regions 148 and 248, heavily doped drain regions 150 and 250, and silicide regions 152 and 252 are formed. The resulting MOS devices in HVNMOS region 100 and HVPMOS region 200 are referred to as HVNMOS device 160 and HVPMOS device 260, respectively. Back-End-Of-Line (BEOL) processes are then performed to form an Inter-Layer Dielectric (ILD, not shown). Contact plugs (not shown) are formed in the ILD and electrically coupled to HVNMOS device 160 and HVPMOS device 260. An interconnect structure (not shown) including metal lines in Inter-Metal Dielectrics (IMDs, not shown) is then formed over and coupled to the contact plugs.

In HVNMOS device 160 and HVPMOS device 260, drain regions 150 and 250 are spaced apart from the respective gate electrodes 142 and 242 and gate spacers 162 and 262 by well regions 128 and 234, respectively. Well regions 128 and 234 have low impurity concentrations. Accordingly, the breakdown voltage of HVNMOS device 160 and HVPMOS device 260 are high.

Figure 6:
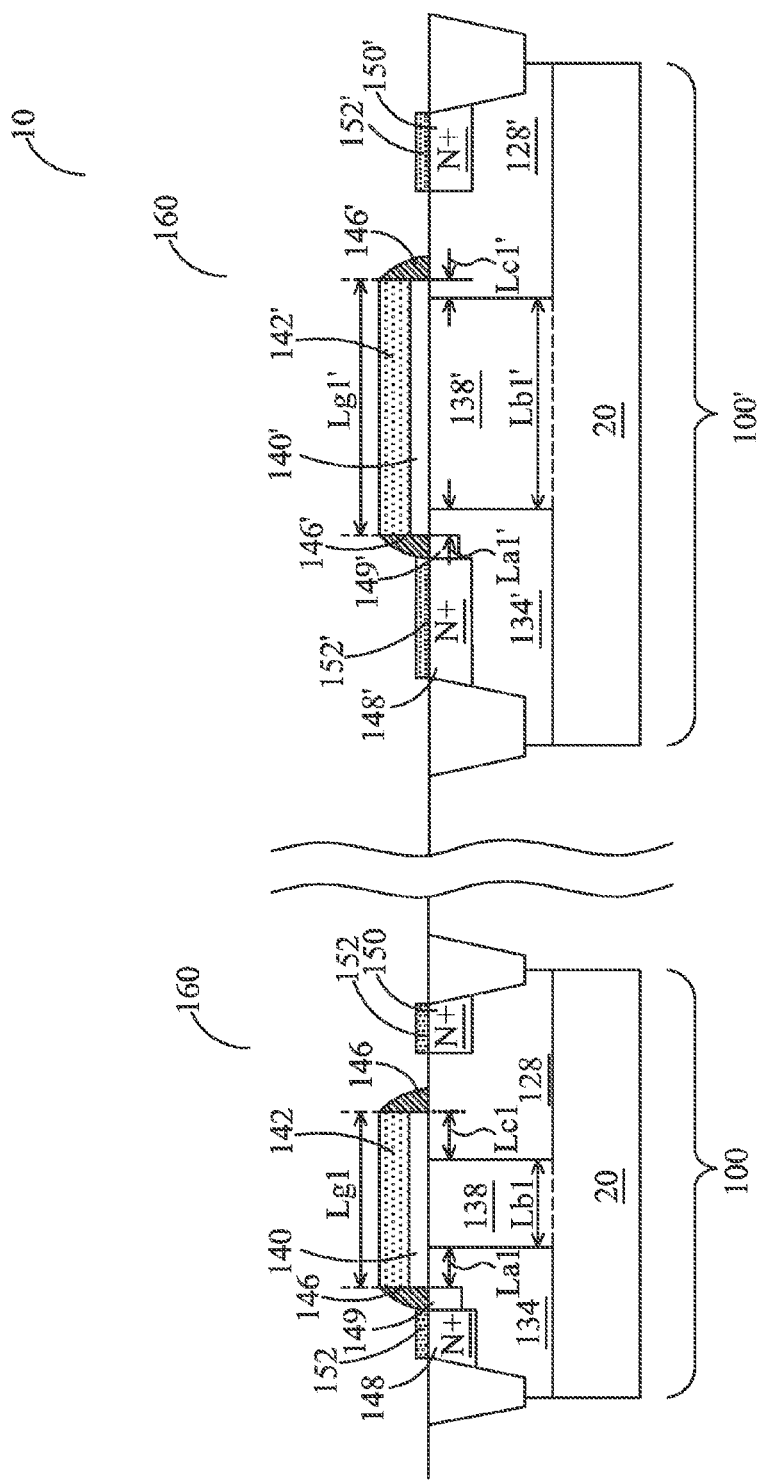
FIG. 6 illustrates the cross-sectional view of two HVNMOS devices in accordance with some exemplary embodiments, wherein the HVNMOS devices have different gate lengths and different native-region lengths.

FIG. 6 illustrates a cross-sectional view of two HVNMOS devices 160 and 160' formed on a same substrate 20 and in a same chip 10. The like components of HVNMOS devices 160 and 160' are denoted using like reference notations, except that the reference notations of the components of HVNMOS device 160' have an additional "'" sign. The structures of HVNMOS devices 160 and 160' may be similar to each other, except the dimensions of the corresponding components may be different from each other. The corresponding components of HVNMOS devices 160 and 160' may be formed simultaneously. For example, n-well regions 128 and 128' are formed simultaneously. P-well regions 134 and 134' are formed simultaneously. The formation processes of HVNMOS device 160' are thus not discussed.

Gate length Lg1' of gate electrode 142' is greater than gate length Lg1 of gate electrode 142. In some exemplary embodiments, gate length Lg1' is greater than about 1.2 times, or greater than about 10 times, gate length Lg1. Source-side overlapping lengths, La1 and La1' may be close to each other. In the illustrated embodiments, source-side overlapping lengths La1 and La1' are measured from the inner edges of lightly doped source regions 149 and 249 to the edges of native regions 138 and 138', respectively. When the diffusion of regions 149/149' is not significant, source-side overlapping lengths La1 and La1' are substantially equal to the overlapping lengths (also marked as La1 and La1' respectively) in FIG. 4.

Overlapping lengths Lc1 and Lc1' may also be close to each other, wherein overlapping length Lc1 is the length of the overlapped portions of gate electrode 142 and n-well region 128. Overlapping length Lc1' is the length of the overlapped regions of gate electrode 142' and n-well region 128'. In some embodiments, the difference (Lg1'−Lg1) between gate lengths Lg1' and Lg1 may be substantially equal to the difference (Lb1'−Lb1) between native-region lengths Lb1' and Lb1. Source-side overlapping lengths La1 and La1', native-region lengths Lb1 and Lb1', and overlap lengths Lc1 and Lc1' may be greater than about 0.05 µm for the stable lithography control. Source-side overlapping lengths La1 and La1' and overlap lengths Lc1 and Lc1' may also be as small as possible providing the margins required by the respective lithography processes are met.

Since gate length Lg1' is greater than gate length Lg1, the added length of Lg1' may be assigned to native region 138', so that native-region length Lb1' is increased over native-region length Lb1. Alternatively stating, when a first HVMOS device has a greater gate length than a second HVMOS device, the respective native-region length (such as Lb1 and Lb1') of the first HVMOS device is also greater than that of the second HVMOS device. In a same chip, there may be a plurality (such as three, four, five, or more) of HVMOS devices that have gate lengths different from each other. The respective native-region lengths of the HVMOS devices are accordingly different from each other. The plurality of HVMOS devices may have similar source-side overlapping lengths (such as La1 and La1'). The drain-side overlap lengths (such as Lc1 and Lc1') of the plurality of HVMOS devices may also be similar to each other.

Furthermore, with the increase in the native-region lengths of HVMOS devices, the ratios of native-region lengths to the respective gate lengths of the HVMOS devices may also increase. For example, in FIG. 6, ratio Lb1'/Lg1' is greater than ratio Lb1/Lg1. Accordingly, value (1−(La1+Lc1))/Lg1 is smaller than value (1−(La1'+Lc1'))/Lg1'.

Figure 7:
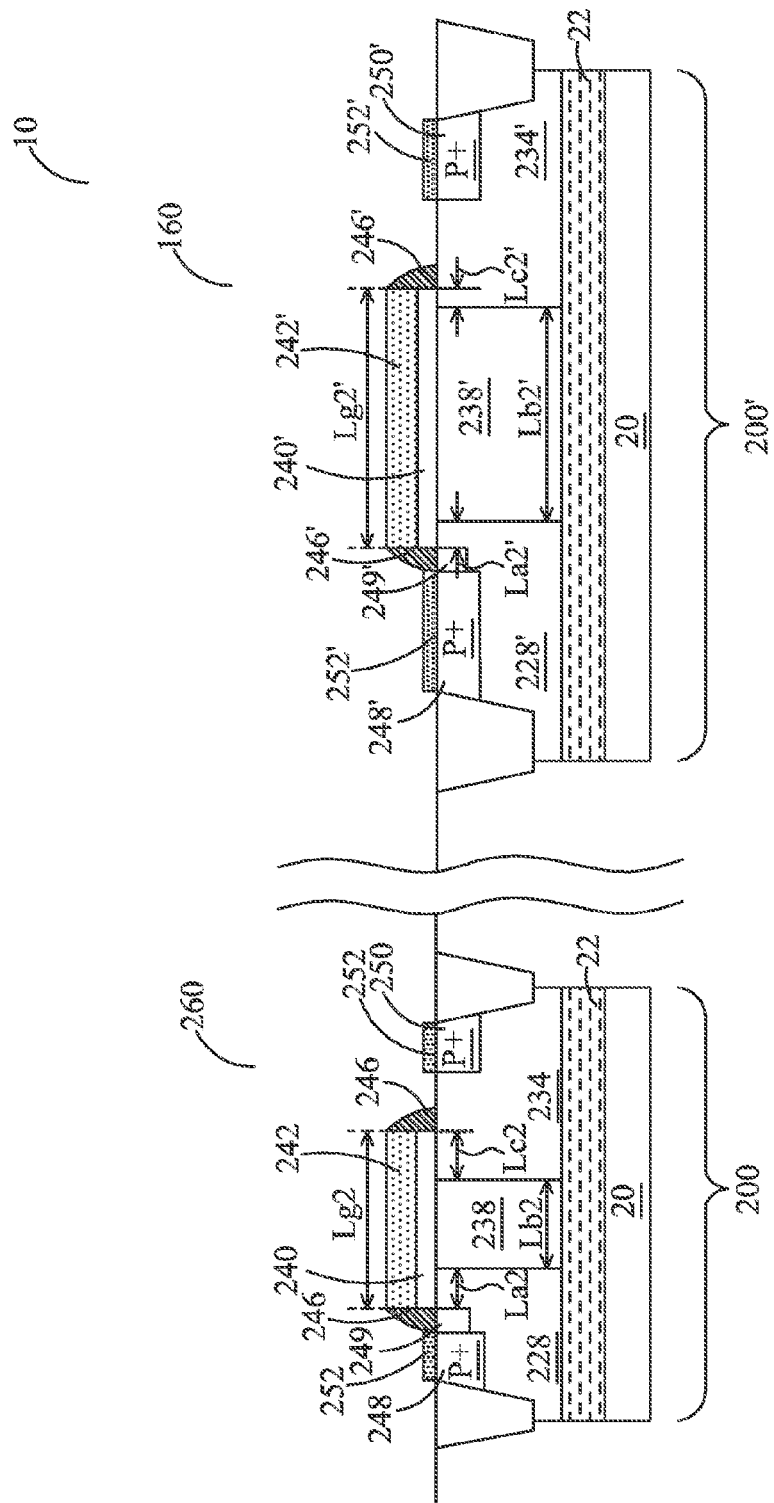
FIG. 7 illustrates the cross-sectional view of two HVPMOS devices in accordance with some exemplary embodiments, wherein the HVPMOS devices have different gate lengths and different native-region lengths.

FIG. 7 illustrates the cross-sectional views of HVPMOS devices. On a same chip 10, there may be a plurality (such as two, three, four, five, or more) of HVPMOS devices that have gate lengths different from each other. For example, in FIG. 7, there are HVPMOS devices 260 and 260' formed on the same substrate 20. The like components of HVPMOS devices 260 and 260' are denoted using like reference numerals, except that the reference notation of the components of HVPMOS device 260' have an additional "'" sign.

In the embodiments illustrated in FIG. 7, the relationship of gate lengths Lg2 and Lg2', source-side overlapping lengths La2 and La2', native-region lengths Lb2 and Lb2', and overlapping lengths Lc2 and Lc2' may also be the same as the respective gate lengths Lg1 and Lg1', native-region lengths Lb1 and Lb1' and overlapping lengths Lc1 and Lc1' of the HVNMOS devices 160 and 160' as in FIG. 6. For example, gate length Lg2' is greater than gate length Lg2, and native-region length Lb2' is greater than native-region length Lb2. The plurality of HVPMOS devices formed on the same chip 10 and having different gate lengths may have similar source-side overlapping lengths (such as La2 and La2') regardless of the respective gate lengths. The drain-side overlapping lengths (such as Lc2 and Lc2') may also be similar to each other regardless of the respective gate lengths.

Although the illustrated embodiments show planar HVPMOS devices and planar HVNMOS devices, the teaching of the embodiments is readily applicable to p-type and n-type HV Fin Field-Effect Transistors (FinFETs). In the corresponding embodiments, the teaching regarding FIGS. 6 and 7 is also the same for the FinFETs that have different gate lengths. For example, the FinFETs with greater gate lengths have greater native-region lengths.

In the embodiments, long-gate HVMOS devices may benefit from the increase in gate lengths when the respective native-region lengths are increased. Simulation results indicate that by increasing the native-region lengths of the long-gate HVMOS devices, the threshold voltages, the saturation currents, and the trans-conductance of the HVMOS devices may be improved significantly, and may be several times better than if the native-region lengths are not increased. As a comparison, in conventional HVMOS devices, the lengths of the native regions are fixed throughout a chip even though the gate lengths of the HVMOS devices are different from each other. Although fixing the lengths of the native regions may result in the improvement of the devices in some situations, with the use of metal gates, the work functions of the metal gates may not be silicon band-edge work functions, and the improvement resulted from fixing the lengths of the native regions, if any, become insignificant. Accordingly, the native-region lengths of the HVMOS devices are increased to gain the benefit.

In accordance with embodiments, a device includes a first and a second HVMOS device, each includes a gate electrode over a semiconductor substrate, wherein the gate electrodes of the first and the second HVMOS devices have a first gate length and a second gate length, respectively, with the second gate length being greater than the first gate length. Each of the first and second HVMOS devices includes a first and a second well region of a p-type and an n-type, respectively, and a native region between and contacting the first and the second well regions. The first and the second well regions have higher impurity concentrations than the native region. The native region of the first HVMOS device and the native region of the second HVMOS device have a first native-region length and a second native-region length, respectively, wherein the second native-region length is greater than the first native-region length.

In accordance with other embodiments, a device includes a semiconductor substrate, and a first and a second HVMOS device. The first HVMOS device includes a first gate electrode over the semiconductor substrate and having a first gate length, a first source region and a first drain region of a first conductivity type on opposite sides of the first gate electrode, and a first well region of a second conductivity type opposite the first conductivity type. The first well region extends from the first source region to directly underlying the first gate electrode. The first HVMOS device includes a second well region of the first conductivity type, wherein the second well region extends from the first drain region to directly underlying the first gate electrode, and a first native region between and contacting the first well region and the second well region. The first native region has a first native-region length. The second HVMOS device includes a second gate electrode over the semiconductor substrate and having a second gate length greater than the first gate length, a second source region and a second drain region of the first conductivity type on opposite sides of the second gate electrode, and a third well region of the second conductivity type. The third well region extends from the second source region to directly underlying the second gate electrode. The second HVMOS device further includes a fourth well region of the first conductivity type, wherein the fourth well region extends from the second drain region to directly underlying the second gate electrode, and a second native region between the third well region and the fourth well region. The second native region has a second native-region length greater than the first native-region length.

In accordance with yet other embodiments, a method includes forming a first and a second HVMOS device on a semiconductor substrate. The step of forming each of the first and the second HVMOS devices includes forming a gate electrode over the semiconductor substrate, wherein the first and second HVMOS devices have a first gate length and a second gate length, respectively, with the second gate length being greater than the first gate length. The method further includes performing implantations to form a first and a second well region of a p-type and an n-type, respectively. Each of the first and the second well regions is vertically aligned to a portion of the gate electrode. A region of the semiconductor substrate between and contacting the first and the second well regions forms a native region. The native region of the first HVMOS device and the native region of the second HVMOS device have a first native-region length and a second native-region length, respectively, with the second native-region length being greater than the first native-region length.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
a semiconductor substrate;
a first and a second High-Voltage Metal-Oxide-Semiconductor (HVMOS) device, each comprising:
a gate electrode over the semiconductor substrate, wherein the gate electrode of the first HVMOS device and the gate electrode of the second HVMOS device have a first gate length and a second gate length, respectively, with the second gate length being greater than the first gate length;

a first and a second well region of a p-type and an n-type, respectively, wherein each of the first and the second well regions overlaps a portion of the gate electrode; and a native region between and contacting the first and the second well regions, wherein the first and the second well regions have higher impurity concentrations than the native region, wherein the native region of the first HVMOS device and the native region of the second HVMOS device have a first native-region length and a second native-region length, respectively, and wherein the second native-region length is greater than the first native-region length.

2. The device of claim 1, wherein the first and the second HVMOS devices are n-type HVMOS devices.

3. The device of claim 1, wherein the first and the second HVMOS devices are p-type HVMOS devices.

4. The device of claim 1, wherein a difference between the second gate length and the first gate length is substantially equal to a difference between the second native-region length and the first native-region length.

5. The device of claim 1, wherein the gate electrode and the first well region of the first HVMOS device have a first overlap length, and the gate electrode and the first well region of the second HVMOS device have a second overlap length substantially equal to the first overlap length, and wherein the first well region of the first HVMOS device contacts a drain region of the first HVMOS device, and the first well region of the second HVMOS device contacts a drain region of the second HVMOS device.

6. The device of claim 1, wherein the gate electrode and the first well region of the first HVMOS device have a first overlap length, and the gate electrode and the first well region of the second HVMOS device have a second overlap length substantially equal to the first overlap length, and wherein the first well region of the first HVMOS device contacts a source region of the first HVMOS device, and the first well region of the second HVMOS device contacts a source region of the second HVMOS device.

7. The device of claim 1, wherein the gate electrode of the first HVMOS device and the gate electrode of the second HVMOS device are metal gate electrodes.

8. The device of claim 1 further comprising a third HVMOS device disposed at a surface of the semiconductor substrate, wherein a gate electrode of the third HVMOS device is longer than the gate electrode of the second HVMOS device, and wherein a third native region of the third HVMOS device is longer than the native-region of the second HVMOS device.

9. A device comprising:
a semiconductor substrate;
a first High-Voltage Metal-Oxide-Semiconductor (HVMOS) device comprising:
  a first gate electrode over the semiconductor substrate and having a first gate length;
  a first source region and a first drain region of a first conductivity type on opposite sides of the first gate electrode;
  a first well region of a second conductivity type opposite the first conductivity type, wherein the first well region extends from the first source region to underlying the first gate electrode;
  a second well region of the first conductivity type, wherein the second well region extends from the first drain region to underlying the first gate electrode; and
  a first native region between and contacting the first well region and the second well region, wherein the first native region has a first native-region length; and
a second HVMOS device comprising:
  a second gate electrode over the semiconductor substrate and having a second gate length greater than the first gate length;
  a second source region and a second drain region of the first conductivity type on opposite sides of the second gate electrode;
  a third well region of the second conductivity type, wherein the third well region extends from the second source region to underlying the second gate electrode;
  a fourth well region of the first conductivity type, wherein the fourth well region extends from the second drain region to underlying the second gate electrode; and
  a second native region between the third well region and the fourth well region, wherein the second native region has a second native-region length greater than the first native-region length.

10. The device of claim 9, wherein the first and the second HVMOS devices are n-type HVMOS devices.

11. The device of claim 9, wherein the first and the second HVMOS devices are p-type HVMOS devices.

12. The device of claim 9, wherein a difference between the second gate length and the first gate length is substantially equal to a difference between the second native-region length and the first native-region length.

13. The device of claim 12, wherein the first gate electrode and the second well region have a first overlap length, and wherein the second gate electrode and the fourth well region have a second overlap length substantially equal to the first overlap length.

14. The device of claim 9, wherein the first gate electrode and the second gate electrode are metal gate electrodes.

15. A method comprising:
forming a first and a second High-Voltage Metal-Oxide-Semiconductor (HVMOS) device on a semiconductor substrate, wherein the step of forming each of the first and the second HVMOS devices comprises:
  forming a gate electrode over the semiconductor substrate, wherein the first and second HVMOS devices have a first gate length and a second gate length, respectively, with the second gate length being greater than the first gate length; and
  performing implantations to form a first and a second well region of a p-type and an n-type, respectively, wherein each of the first and the second well regions overlaps a portion of the gate electrode, wherein a region of the semiconductor substrate between and contacting the first and the second well regions forms a native region, wherein the native region of the first HVMOS device and the native region of the second HVMOS device have a first native-region length and a second native-region length, respectively, with the second native-region length being greater than the first native-region length.

16. The method of claim 15, wherein during the implantations to form the first and the second well regions, the native region is not implanted.

17. The method of claim 15 further comprising, for each of the first and the second HVMOS devices, forming a source region and a drain region in contact with the first and the second well regions, respectively, and wherein the source region and the drain region are of p-type.

18. The method of claim 17 further comprising forming a n-type buried layer under and contacting the first and the second well regions of the first and the second HVMOS devices.

19. The method of claim 15 further comprising, for each of the first and the second HVMOS devices, forming a source region and a drain region in contact with the first and the second well regions, respectively, and wherein the source region and the drain region are of n-type.

20. The method of claim 15, wherein the gate electrode and the first well region of the first HVMOS device have a first overlapping length, and the gate electrode and the first well region of the second HVMOS device have a second overlapping length substantially equal to the first overlapping length, and wherein the gate electrode and the second well region of the first HVMOS device have a third overlapping length, and the gate electrode and the second well region of the second HVMOS device have a fourth overlapping length substantially equal to the third overlapping length.

* * * * *